United States Patent [19]

Melcher et al.

[11] Patent Number: 5,056,040

[45] Date of Patent: Oct. 8, 1991

[54] ELECTRIC BALANCE WITH DIGITAL DISPLAY

[75] Inventors: Franz-Josef Melcher, Hardegsen; Christoph Berg, Adelebsen; Christian Oldendorf, Göttingen, all of Fed. Rep. of Germany

[73] Assignee: Sartorius AG, Göttingen, Fed. Rep. of Germany

[21] Appl. No.: 249,827

[22] Filed: Sep. 27, 1988

[30] Foreign Application Priority Data

Oct. 22, 1987 [DE] Fed. Rep. of Germany ........ 3735733

[51] Int. Cl.$^5$ .............................................. G06F 15/20
[52] U.S. Cl. ..................................... 364/518; 340/794
[58] Field of Search ...................... 177/25.15; 340/794; 364/466, 518, 567, 568

[56] References Cited

U.S. PATENT DOCUMENTS

| 4,420,976 | 12/1983 | Orloff et al. | 364/509 X |
| 4,725,656 | 4/1973 | Fukuma | 364/466 |
| 4,814,896 | 3/1989 | Heitzman et al. | 340/721 X |

Primary Examiner—Parshotam S. Lall
Assistant Examiner—Edward R. Cosimano
Attorney, Agent, or Firm—Eric P. Schellin

[57] ABSTRACT

There is disclosed an electric balance with a sensor (2), a digital signal processing unit (4), a digital display (5) and switching means (6) which suppress the leading zeros in the digital display by a control means (7) which activates and deactivates the switching means (6) for suppressing leading zeros as a function of the sign of the result of measuring. In this manner, a change of sign can be signaled more clearly. It is also possible to display more leading zeros as the magnitude of the deviation of the result of measuring from the value zero increases so that the leading zeros appear in several stages, starting from zero up to a set measuring value.

5 Claims, 3 Drawing Sheets

```
-      0,2
-      0,1
-      0,0
+      0,0
+     00,1
+    000,2
+   0000,3
+  00000,4
```

```
+      0,2
+      0,1
+      0,0
-------0,0
------0,1
-----0,2
```

5,056,040

ELECTRIC BALANCE WITH DIGITAL DISPLAY

BACKGROUND OF THE INVENTION

1. Field of the Invention

The invention relates to an electric balance with a sensor, a digital signal processing unit, a digital display and with switching means which suppress leading zeros in the digital display.

Balances of this type are generally known. The suppression of leading zeros is generally customary in displays with four and more positions in order not to render the reading of the result more difficult with the leading zeros, which do not contain any information.

However, a disadvantage of this is the fact that in displays with four and more positions, the sign of the result of measuring, which is normally at the far left, is relatively far removed from the numbers of the result of measuring when the leading zeros are suppressed and is therefore sometimes not observed.

The invention therefore has the problem of distinguishing positive and negative results of measuring, especially in the vicinity of zero, in a clear and more noticeable manner.

SUMMARY OF THE INVENTION

The invention solves this problem by providing a control means which activates or deactivates the switching means for the suppression of leading zeros according to the sign of the result of measuring.

As a result, the suppression of leading zeros is activated in the weighing area normally used, e.g. with positive results of measuring in the display, and the accustomed display appears (e.g. 0.3 g). Then, in the case of negative results of measuring, the suppression of leading zeros is deactivated and all leading zeros also appear next to the negative sign (e.g. −00000.3 g). This effectively prevents a confusion of positive and negative results of measuring during reading.

However, the normally-used weighing area can also be the one with a negative sign. For example, when dosing, the theoretical value to be dosed in is frequently stored in a tare memory and subtracted from the actual measured value. The dosing is then performed starting from the negative theoretical value up to zero. It is particularly important in this case to display the sign in the vicinity of zero in a prominent manner since in the case of small negative values, a little still has to be dosed in whereas in the case of small positive values, there is already a small overdosage. In this instance the suppression of leading zeros is advantageously activated in the case of negative results of measuring and at 0.0 g and is deactivated in the case of positive results of measuring. It is advantageous in this embodiment if the control means for activating and deactivating the suppression of leading zeros is activated only in the case of a used tare memory whereas if the tare memory is not in use, the leading zeros are e.g. continuously suppressed.

The suppression of leading zeros can also take place in several stages in an advantageous further development, in which instance one leading zero more is displayed in each stage; the control means is designed in such a manner in this instance that it considers not only the sign of the result of measuring but also the magnitude of the result of measuring and suppresses a greater or lesser number of leading zeros as a function of the magnitude of the deviation of the result of measuring from the value zero. This can take place in such a manner, for example, in an advantageous embodiment that in the case of negative results of measuring and at the result 0.0 g, all leading zeros are suppressed, that in the case of a result of measuring of +1 digit, one leading zero fewer is suppressed (display therefore 00.1 g), that in the case of a result of measuring of +2 digits, two leading zeros fewer are suppressed (display therefore 000.2 g), that in the case of a result of measuring of +3 digits, three leading zeros fewer are suppressed (display therefore 0000.3 g) and so forth until no leading zero is suppressed any longer.

In an advantageous further development the leading zeros are suppressed as usual in the case of positive results of measuring and at the measured result zero and in the case of negative results of measuring, this suppression of leading zeros is deactivated and instead of the leading zeros, "minus signs" are displayed. This refers to the negative sign again in an especially clear manner.

BRIEF DESCRIPTION OF THE DRAWINGS

The invention is described in the following with reference made to the drawings.

DETAILED DESCRIPTION OF THE INVENTION

Figure 1:
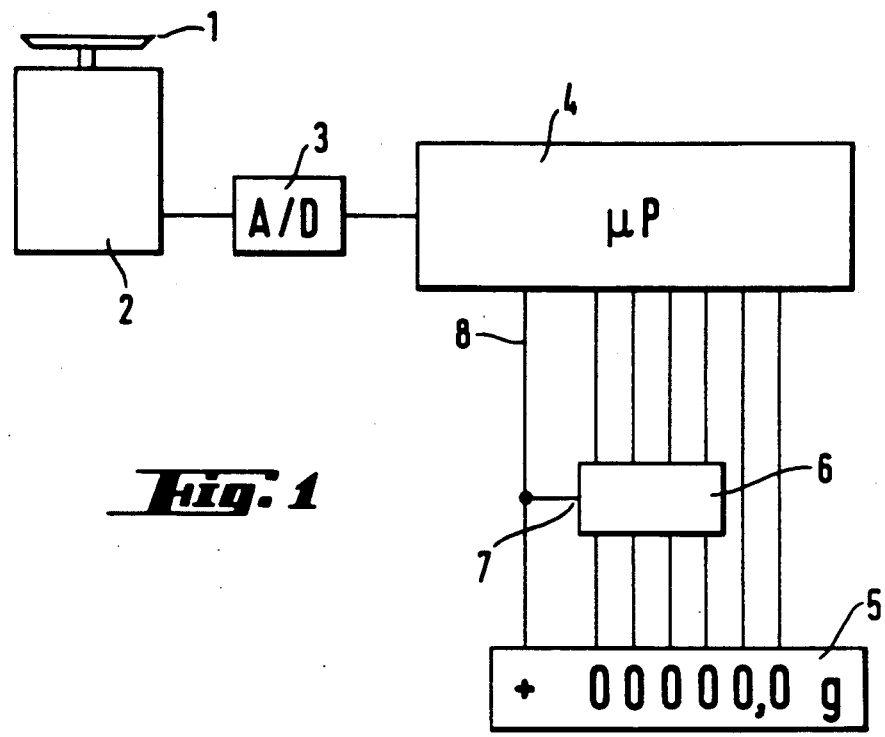
FIG. 1 shows a block diagram of the balance in a first embodiment.

In the block diagram of FIG. 1, sensor 2 of the balance with balance scale 1 is indicated only schematically since it is deemed sufficient for a comprehension of the invention. The output signal of the sensor 2 is digitized in analog digitizer 3 and then fed to digital signal processing unit 4. The digital signal processing unit can be constituted e.g. by a microprocessor. The result of measuring is passed on from digital signal processing unit 4 to digital display 5. In the example shown of a balance with 0.1 g resolution, the signals of the two last decades are fed directly to the display whereas the signals of the other, higher-value decades run over switching means 6 which suppresses the leading zeros in a manner which is known and therefore not explained. These switching means 6 comprise control input 7 which is connected to sign lead 8. Depending on the logical signal on control input 7, switching means 6 suppresses the leading zeros (activation of suppression of leading zeros) or it passes the leading zeros unchanged on to display 5 (deactivation of suppression of leading zeros). Whether the leading zeros are suppressed in the display in the case of positive or of negative signs of the result of measuring can be easily selected by interposing an inverter in front of control input 7, such as an inverter 10 of FIG. 3, depending on the usage desired.

Figures 2, 5, 6:
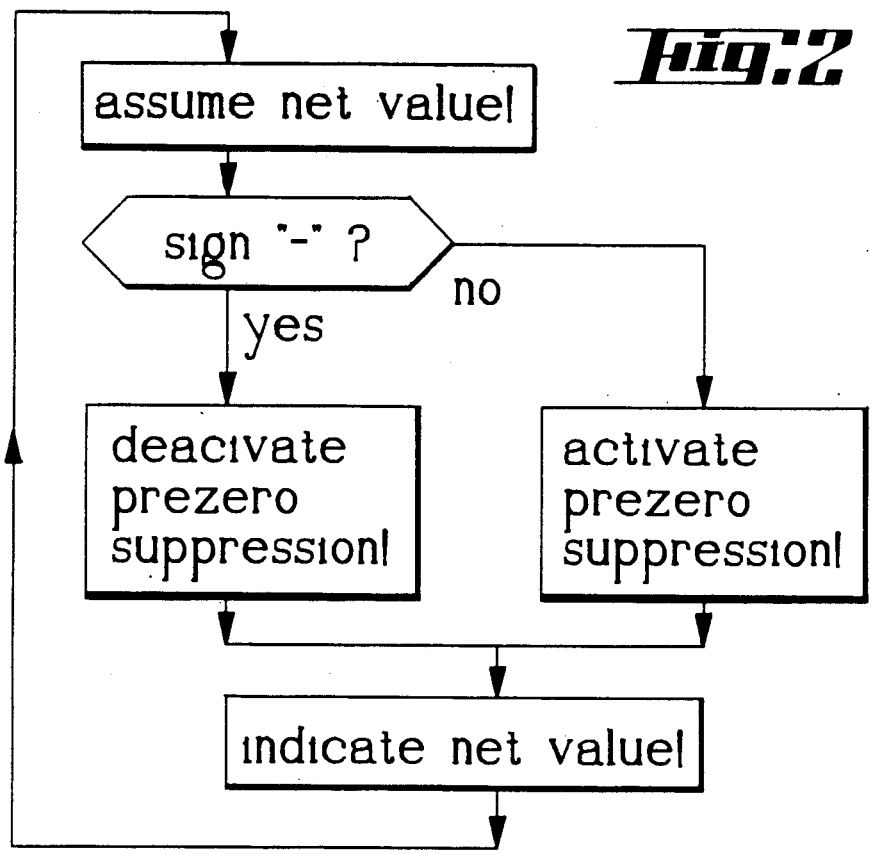
FIG. 2 shows an associated flow chart.
FIG. 5 shows a list of the balance display in a first embodiment.
FIG. 6 shows a list of the balance display in a second embodiment.

The flow chart of FIG. 2 shows the logical sequence of operations in the circuit of FIG. 1. It is assumed here that the suppression of leading zeros is activated in the case of positive signs and a result of measuring of 0.0 g.

The net value 22 of its sign at 24 which is to be displayed in the display 30 is taken in the digital signal processing unit from the appropriate memory, the circuit for suppressing the leading zeros is activated 26 or deactivated at 28 as a function of the sign of the net value and the net value displayed at 30 without or with leading zeros.

The flow chart of FIG. 2 shows that the activation and deactivation of the suppression of leading zeros and the suppression of leading zeros itself can be readily implemented as a logical sequence of operations in the microprocessor of the digital signal processing unit so that in FIG. 1 the microprocessor of digital signal processing unit 4 can also assume the function of circuit 6 for suppressing leading zeros including the activation/deactivation control input 7.

Figure 3:
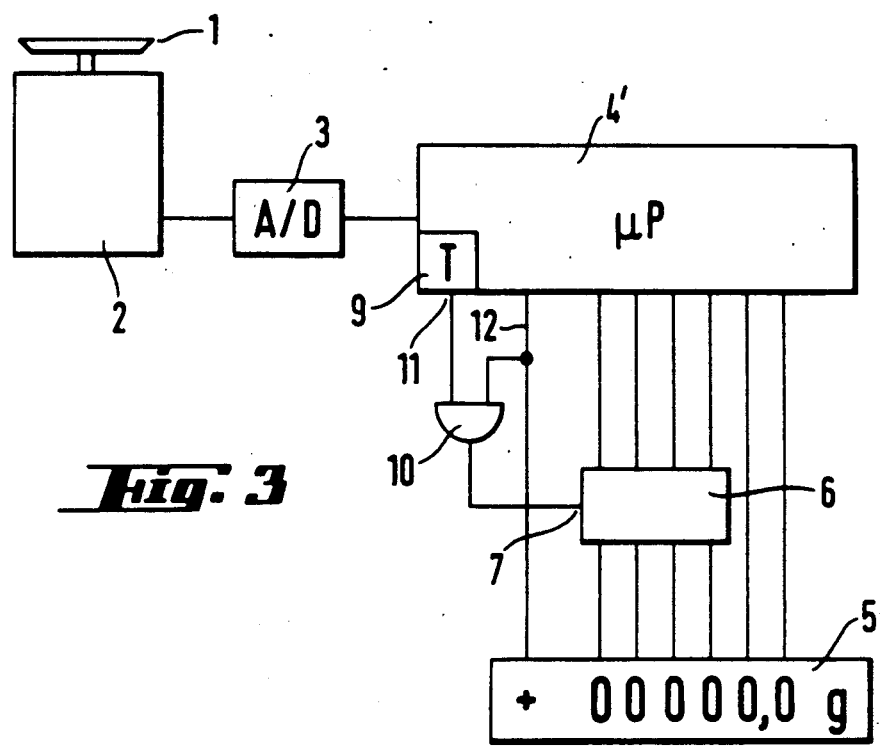
FIG. 3 shows a block diagram of the balance in a second embodiment.
Figure 4:
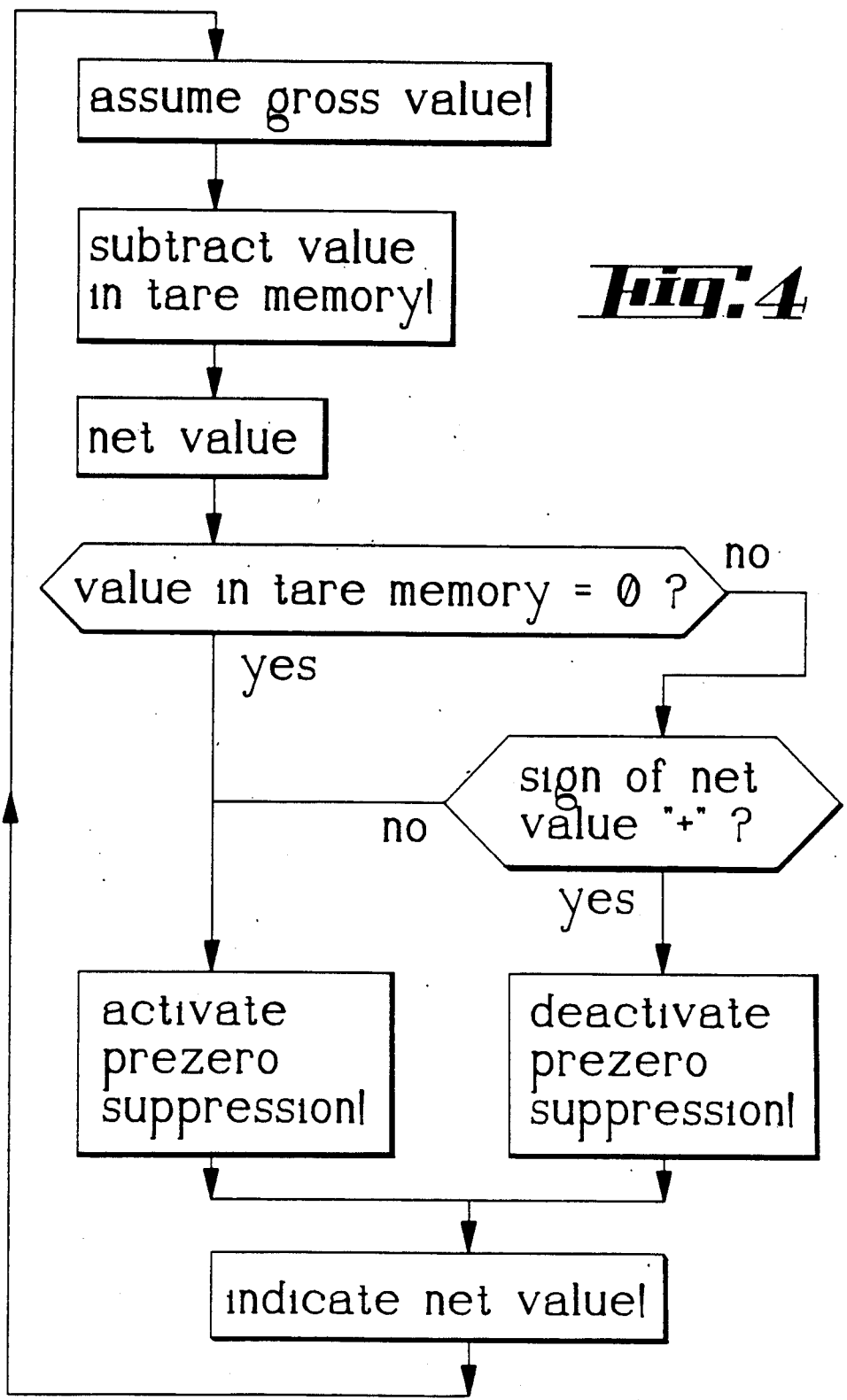
FIG. 4 shows a flow chart associated with the block diagram of FIG. 3.

The block diagram of FIG. 3 shows a second embodiment, which is especially designed for dosings to zero. The parts which are the same as in FIG. 1 are designated with the same reference numbers. Here, digital signal processing unit 4' comprises a tare memory 9 in which the theoretical weight to be dosed is stored. The deactivation of the suppression of leading zeros in switching means 6 takes place in this example only if tare memory 9 is used and a signal therefore appears on output 11 and if the sign is "plus" (signal on lead 12) whereby the signals are fed to a logic element 10 as a result of input 7. In this embodiment, the balance always suppresses the leading zeros when the tare memory is empty—that is, during normal weighing. Not until the tare memory is used, that is, during dosing from a negative theoretical value to zero, are the leading zeros suppressed only in the case of negative signs and at the value 0.0 g whereas in the case of a positive sign the leading zeros are not suppressed. This logical sequence of operations is shown once again in the flow chart of FIG. 4. At 42 the value in the tare memory is subtracted from the gross value, as determined at 40, to provide the net value at 44. At 46 if the value in the tare memory is zero, then prezero suppression is activated at 50. Otherwise the sign of the net value is checked at 48 and if it is not "+", then processing continues at 50 as above. Whereas if the sign of the net value is "+", then prezero suppression is deactivated at 52. After either 50 or 52 the net value is indicated at 54.

It was always assumed up to the present that the leading zeros are either all suppressed or all not suppressed. However, it is also possible to suppress the leading zeros only in part. This possibility is shown in FIG. 5. This figure shows a display in the vicinity of the result zero during a slow dosing-in of material to be weighed. The assumption is made here that the suppression of leading zeros is activated as in the example of FIGS. 3, 4 in the case of a negative sign and at the value 0.0 g. When value 0.0 g is exceeded, the suppression of leading zeros is canceled not all at once but rather by one digit per decade. As a result, the transition does not occur so abruptly and the leading zeros gradually build up. Of course, one leading zero more can appear every 2 digits or every 5 digits or every 10 digits; or, the incremental limits are selected as a function of the theoretical weight in such a manner that e.g. all leading zeros appear at a permitted tolerance of 0.5%.

FIG. 6 shows another example. The assumption is made here that, as in the example of FIGS. 1, 2, the suppression of leading zeros is activated in the case of positive signs and at the value 0.0 g but not in the case of negative signs. In this example, "minus" signs are displayed instead of the leading zeros in order to reinforce the signaling action of the normal "minus" sign at the far left in the display.

The examples of FIGS. 5, 6 are explained only with the illustration of the display. Any electronic expert can easily create these displays by means of appropriate switching means or by designing an appropriate program for a microprocessor, so that details can be dispensed with here.

The embodiments described above are of course only examples. Thus, for example, the graduated cutting in of the leading zeros (as in FIG. 5) can also be used for the appearance of the "minus" signs in FIG. 6. Or, given the appropriate design of the display in the example of FIG. 6, "plus" signs can also appear instead of the leading zeros and in the case of negative signs of the result of measuring, the leading zeros are suppressed.

We claim:

1. An electric balance comprising:
    a sensor (2) for measuring a load on a balance scale (1) and producing a measured result output,
    digital signal processing unit (4,4') responsive to the measured result output of the sensor (2) and having a decade output means which includes an output to indicate the sign of the measured result;
    digital display (5) coupled to the digital signal processing unit (4,4') through the decade output means,
    switching means (6) coupled, between the decade output means and the display means (5), to a portion of the output from the decade output means to suppress the leading zeros supplied to the digital display (5), and wherein the switching means (6) for the suppression of leading zeros consist of a control input means (7) which selectively activates and deactivates the switching means (6) for the suppression of the leading zeros derived according to the sign of the measured result output.

2. Electric balance according to claim 1, wherein the control means (7) deactivates the switching means (6) for suppression of the leading zeros in the case of a negative sign signal of the measured result output and that if suppression of the leading zeros is deactivated, "minus" signs are displayed at least partially instead of the leading zeros.

3. Electric balance according to claim 1 wherein a tare memory (9) is included in the digital signal processing unit (4,4') and the control input means (7) is only activated when the tare memory (9) is used.

4. Electric balance according to claim 1 or 3 wherein the switching means (6) for the suppression of the leading zero occurs in several stages, in which instance one of the leading zeros is displayed in each stage and that the control input means (7) activates one of the stages of the suppression of the leading zeros as a function of the sign signal of the measured result output and as a function of a magnitude of deviation of the measured result output from value zero.

5. Electric balance according to claim 4, wherein a case of a non-positive measured result output, all the leading zeros are suppressed, that as a result of measuring of +1 digit, one less of the leading zeros is suppressed, that as the measured result output of +2 digits, two less of the leading zeros are suppressed, and so forth.

* * * * *